(12) United States Patent
Fry et al.

(10) Patent No.: US 10,903,184 B2
(45) Date of Patent: Jan. 26, 2021

(54) FILLER PARTICLE POSITION AND DENSITY MANIPULATION WITH APPLICATIONS IN THERMAL INTERFACE MATERIALS

(71) Applicant: INTERNATIONAL BUSINESS MACHINES CORPORATION, Armonk, NY (US)

(72) Inventors: Jonathan Fry, Fishkill, NY (US); Tuhin Sinha, Oradell, NJ (US); Michael Rizzolo, Albany, NY (US); Bassem M. Hamieh, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/109,182

(22) Filed: Aug. 22, 2018

(65) Prior Publication Data

US 2020/0066669 A1    Feb. 27, 2020

(51) Int. Cl.
| | |
|---|---|
| *H01L 23/00* | (2006.01) |
| *H01L 43/02* | (2006.01) |
| *H01L 23/367* | (2006.01) |
| *H01L 43/12* | (2006.01) |

(52) U.S. Cl.
CPC .......... *H01L 24/27* (2013.01); *H01L 23/3675* (2013.01); *H01L 24/32* (2013.01); *H01L 24/83* (2013.01); *H01L 43/02* (2013.01); *H01L 43/12* (2013.01); *H01L 2224/2755* (2013.01); *H01L 2224/27515* (2013.01); *H01L 2224/27848* (2013.01); *H01L 2224/32245* (2013.01); *H01L 2924/1443* (2013.01)

(58) Field of Classification Search
CPC ................................ H01L 24/83; H01L 24/27
See application file for complete search history.

(56) References Cited

U.S. PATENT DOCUMENTS

| | | | |
|---|---|---|---|
| 6,231,760 B1 * | 5/2001 | Siddiqi | B03C 1/01 210/222 |
| 6,764,859 B1 * | 7/2004 | Kreuwel | C12Q 1/6806 436/178 |
| 7,014,093 B2 * | 3/2006 | Houle | B23K 1/0016 228/56.3 |

(Continued)

*Primary Examiner* — Mohammed Shamsuzzaman
*Assistant Examiner* — Khatib A Rahman
(74) *Attorney, Agent, or Firm* — Tutunjian & Bitetto, P.C.; Anthony Curro (57) ABSTRACT

A thermal interface material and systems and methods for forming a thermal interface material include depositing a layer of a composite material, including at least a first material and a second material, the first material including a carrier fluid and the second material including a filler particle suspended within the first material. A particle manipulator is positioned over the layer of the composite material, the particle manipulator including at least one emitter to apply a particle manipulating field to bias a movement of the filler particles. The second material is redistributed by applying the particle manipulating field to interact with the second material causing the second material to migrate from a surrounding region in the composite material into a high concentration region in the composite material to form a customized thermal interface such that the high concentration region is configured and positioned corresponding to a hotspot.

20 Claims, 8 Drawing Sheets

(56) References Cited

U.S. PATENT DOCUMENTS

| | | |
|---|---|---|
| 7,282,799 B2 | 10/2007 | Brunschwiler et al. |
| 7,886,813 B2 * | 2/2011 | Hua .................... H01L 23/3737 |
| | | 165/185 |
| 8,647,752 B2 * | 2/2014 | Strader .............. H05K 7/20472 |
| | | 428/614 |
| 9,330,998 B2 * | 5/2016 | Strader .................. H05K 23/42 |
| 2003/0168731 A1 * | 9/2003 | Matayabas, Jr. .... H01L 23/3737 |
| | | 257/712 |
| 2004/0021073 A1 * | 2/2004 | Barbic ................ B01F 13/0818 |
| | | 250/298 |
| 2004/0151885 A1 | 8/2004 | Jayaraman et al. |
| 2004/0261980 A1 | 12/2004 | Dani et al. |
| 2005/0045855 A1 * | 3/2005 | Tonapi .................... C09K 5/14 |
| | | 252/500 |
| 2005/0056365 A1 * | 3/2005 | Chan ....................... H01L 24/29 |
| | | 156/307.7 |
| 2008/0023665 A1 * | 1/2008 | Weiser ................ H01L 23/3737 |
| | | 252/71 |
| 2008/0237136 A1 * | 10/2008 | Keijzer ................ B03C 1/0332 |
| | | 210/695 |
| 2009/0321923 A1 * | 12/2009 | Swaminathan ....... H01L 23/295 |
| | | 257/712 |
| 2010/0159556 A1 * | 6/2010 | Rida .................... B01F 13/0077 |
| | | 435/173.7 |
| 2010/0193407 A1 | 8/2010 | Steinberg et al. |
| 2011/0038124 A1 * | 2/2011 | Burnham ................ H01L 24/29 |
| | | 361/717 |
| 2014/0327129 A1 | 11/2014 | Cho et al. |
| 2016/0137900 A1 * | 5/2016 | Lin .................... C08G 18/7671 |
| | | 252/76 |
| 2018/0044480 A1 * | 2/2018 | Shen ...................... H01L 23/42 |
| 2018/0122979 A1 * | 5/2018 | Zajac .................... H01L 31/043 |
| 2018/0249593 A1 * | 8/2018 | Zhang ................ H01L 23/3733 |
| 2018/0269128 A1 * | 9/2018 | Limaye ............... H01L 23/3672 |
| 2018/0297301 A1 * | 10/2018 | Narayanasamy ... H01L 21/4871 |

\* cited by examiner

Depositing a layer of a composite material, including at least a first material and a second material, the first material including a carrier fluid and the second material including a filler particle suspended within the first material
801

Positioning a particle manipulator over the layer of the composite material, the particle manipulator including at least one emitter to apply a particle manipulating field to bias a movement of the filler particles
802

Redistributing the second material by applying the particle manipulating field to interact with the second material causing the second material to migrate from a surrounding region in the composite material into a high concentration region in the composite material to form a customized thermal interface such that the high concentration region has a size, shape and position corresponding to a hotspot
803

FILLER PARTICLE POSITION AND DENSITY MANIPULATION WITH APPLICATIONS IN THERMAL INTERFACE MATERIALS

BACKGROUND

Technical Field

The present invention generally relates to interface materials for forming a thermally conductive path between two layers, and more particularly to filler particle position and density manipulation with applications in thermal interface materials.

Description of the Related Art

As electronic devices operate, internal resistance causes heat around active portions of the device. This heat can cause localized hotspots on a device, such as, e.g., a chip including a memory chip, a processing chip, or other device. The hotspots can cause performance degradation and limit frequencies of operation. Thus, managing the heat generated by the device can degrade the reliability and structural integrity of the device.

SUMMARY

In accordance with an embodiment of the present invention, a method for forming a thermal interface material is described. The method includes depositing a layer of a composite material, including at least a first material and a second material, the first material including a carrier fluid and the second material including a filler particle suspended within the first material. A particle manipulator is positioned over the layer of the composite material, the particle manipulator including at least one emitter to apply a particle manipulating field to bias a movement of the filler particles. The second material is redistributed by applying the particle manipulating field to interact with the second material causing the second material to migrate from a surrounding region in the composite material into a high concentration region in the composite material to form a customized thermal interface such that the high concentration region is configured and positioned corresponding to a hotspot.

In accordance with another embodiment of the present invention, a method for forming a semiconductor device package is described. The method includes depositing a layer of a composite material on a semiconductor device including an active component, the composite material including at least a first material and a second material, the first material including a carrier fluid and the second material including a filler particle suspended within the first material. A particle manipulator is positioned over the layer of the composite material, the particle manipulator including at least one emitter to apply a particle manipulating field to bias a movement of the filler particles. The second material is redistributed by applying the particle manipulating field to interact with the second material causing the second material to migrate from a surrounding region in the composite material into a high concentration region in the composite material to form a customized thermal interface such that the high concentration region is configured and positioned corresponding to a hotspot. A heat sink is attached to the semiconductor device via the layer of the composite material.

In accordance with another embodiment of the present invention, a thermal interface material is described. The thermal interface material includes a layer of a first material including a cured carrier fluid and a second material suspended within the first material such that the second material is concentrated in a high concentration region of the first material to form a customized thermal interface such that the high concentration region is configured and positioned corresponding to a hotspot, the high concentration region being surrounded by a low concentration region having a lower density of the second material than the high concentration region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

According to aspects of the present invention, a thermal interface material is manipulated for improved management of heat generated by a semiconductor device, such as, e.g., a memory chip or a processor chip, among others.

An embodiment of the present invention includes a composite layer that includes filler particles for increasing heat conductivity of the composite layer. These filler particles can decrease the mechanical integrity and reliability of the composite layer. Thus, the filler particles are repositioned within the composite layer, from a uniform density across a volume of the composite layer, to areas of concentration over hotspots on the semiconductor device. Thus, the composite layer is manipulated to concentrate the heat conducting filler particles over the areas where heat is generated, and away from areas that do not generate heat. Thus, heat can be conducted away from the hotspots of the semiconductor device while mechanical reliability is improved over the remainder of the semiconductor device due to the reduced concentration of filler particles.

Because the semiconductor device, such as, e.g., magnetoresistive random access memory (MRAM), among others, can sustain high external magnetic fields without damaging the semiconductor device, magnetism can be used to manipulate the filler particles. Thus, the filler particles are manipulated and repositioned using an electro-magnetic manipulator. The electro-magnetic manipulator includes an electro-magnetic head that generates a magnetic field. Because the filler particles are, e.g., metal particles, the magnetic field influences the movement of the filler particles. Accordingly, an applied magnetic field to the composite layer redistributes the filler particles in by biasing the filler particles to migrate with the direction of the magnetic field to areas of high thermal output of the semiconductor device, such as, e.g., the above described hotspots. Thus, areas of low thermal output, but high mechanical stress, such as, e.g., edges of the semiconductor devices have improved mechanical strength and improved matching coefficients of thermal expansion (CTE) between the semiconductor device and the composite layer.

Therefore, a single composite layer can be used that has multiple different properties such that the composite layer has properties of multiple different thermal interface materials that are locally optimized across a semiconductor device. The locally optimized thermal interface material and improves thermal conduction facilitates improved device performance by facilitating higher frequencies with a lower risk of damage due to high temperatures. Accordingly, the single composite layer is customized to a particular application to optimize heat transfer concurrently with mechanical strength, rather than sacrificing one for the other.

A heat sink can then be provided such that the composite layer forms a thermal interface between the semiconductor device and the heat sink. As a result, the composite layer improves heat conductivity from the semiconductor device to the heat sink while also improving mechanical attachment of the semiconductor device to the heat sink.

Exemplary applications/uses to which the present invention can be applied include, but are not limited to: suspended particulate systems with hybrid local properties, such as, e.g., thermal interface materials for heat storage applications, customized heat conduction pathways for electric device, electric motors, photovoltaic panels, internal combustion engines, and semiconductor device chips, including, e.g., chips including MRAM, resistive random access memory (RRAM), field effect transistors (FET), among others.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 1:
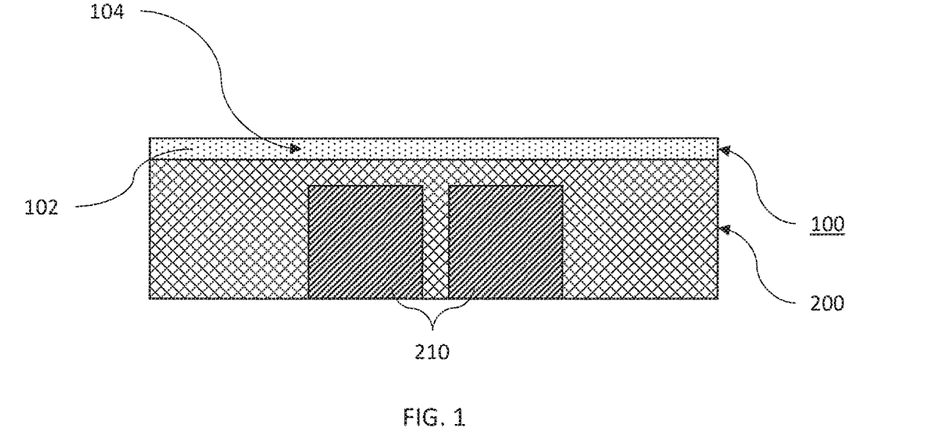
FIG. 1 is a cross-sectional view showing a semiconductor device with a composite layer formed thereon, in accordance with an embodiment of the present invention.

Referring now to the drawings in which like numerals represent the same or similar elements and initially to FIG. 1, a cross-sectional view showing a semiconductor device with a composite layer formed thereon is depicted according to an embodiment of the present invention.

According to an embodiment of the present invention, a semiconductor device 200 is provided. The semiconductor device 200 is any semiconductor based chip that operates based on electrical current and voltage. For example, a device formed of transistors can be a semiconductor device 200. Thus, the semiconductor device 200 can include, e.g., a chip including FETs, MRAM, RRAM and other processing and memory devices. Therefore, the semiconductor device 200 has an internal resistance in active features of the semiconductor device 200. For example, a magnetic tunnel junction (MTJ) of a MRAM device has a resistance according to the orientation of magnetic fields. Such a resistance generates heat upon an applied electrical signal.

On a surface of the semiconductor device 200 is a composite layer 100. The composite layer 100 can be any material composed of two or more different materials. In one possible embodiment, the composite layer 100 includes, e.g., a particle or particles suspended within a carrier. The carrier can be, e.g., a fluid or a solid. However, in one possible embodiment of the present invention, the composite layer 100 is a thermal interface material for transporting the generated heat away from the semiconductor device 200. As such, the composite layer 100 includes, e.g., a fluid carrier and a heat conducting filler particle 104 material suspended therein, such as, e.g., heat conducting filler particles 104 (as depicted by the dots of the composite layer 100 in the figures). The composite layer 100 can also include other materials, such as, e.g., additional particles, surfactants, fluid mixtures, reinforcements formed from solid materials such as, e.g., a frame including a metal, plastic, glass or other material. Because the filler particles 104 transport heat from the semiconductor device 200, the filler particles 104 can include suitable heat conducting particles. As will be described below, the filler particles 104 may be manipulated by a magnetic field. Thus, suitable materials for filler particles 104 can include heat conducting particles that are ferromagnetic, diamagnetic and/or paramagnetic, such as, e.g., silver (Ag), gold (Au), copper (Cu), aluminum (Al), iron (Fe), boron nitride (BN), graphite, graphene, zinc (Zn), zinc oxide (ZnO), diamond, among others and alloys and combinations thereof. Filler particles 104 can include any suitable size for being suspended within the composite layer 100. However, according to an embodiment of the present invention, the filler particles 104 have diameters in a range of between about 1 nanometer (nm) to about 50 micrometers (μm).

In one possible embodiment, the composite layer 100 can be formed by a deposition process such as, for example, dip coating, spin-coating, brush coating, sputtering, chemical vapor deposition, plasma enhanced chemical vapor deposition, chemical solution deposition, physical vapor deposition, and/or plating. When the composite layer 100 is a spall inducing tape layer, the spall inducing tape layer can be applied by hand or mechanical means. The filler particles 104 can be included in the composite layer 100, e.g., during deposition or implanted after deposition of another material of the composite layer 100. The other material of the composite layer 100 can include, e.g., an adhesive or glue such as an epoxy or other adhesive material to provide mechanical attachment between the semiconductor device 100 another structure. The filler particles 104 can occur in the composite layer 100, e.g., in a homogenous distribution 102 of filler particles 104. However, the filler particles 104 may have any distribution within the composite layer 100.

Figure 2:
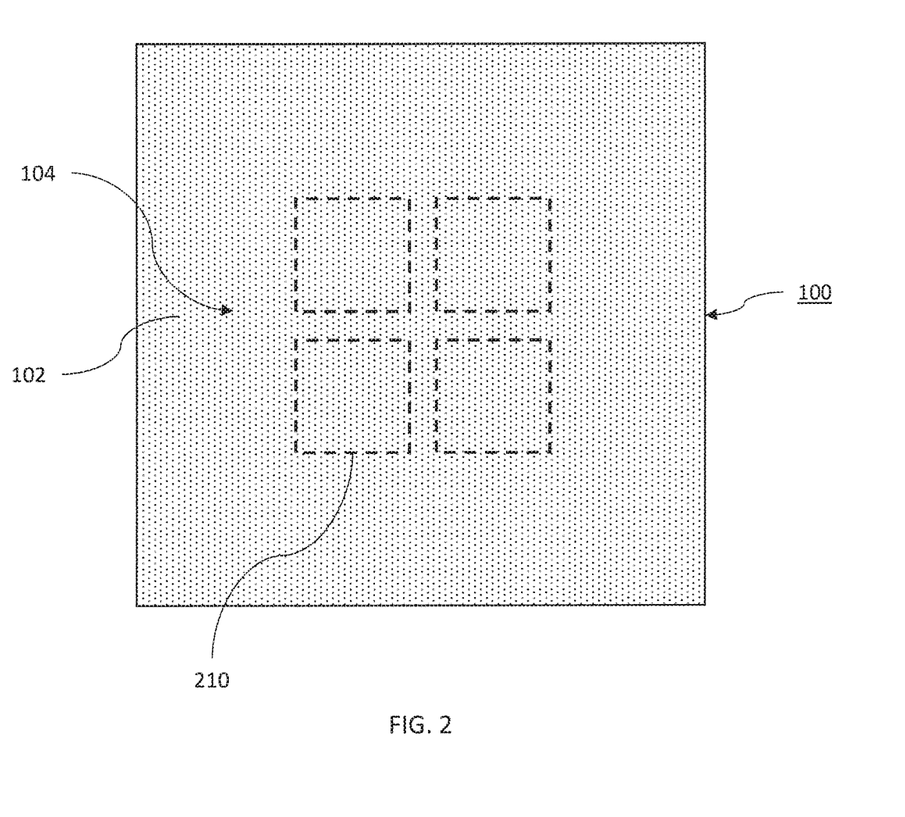
FIG. 2 is a top view showing the semiconductor device with the composite layer of FIG. 1, in accordance with an embodiment of the present invention.

Referring now to FIG. 2, a top view showing the semiconductor device with the composite layer of FIG. 1 is depicted according to an embodiment of the present invention.

According to an embodiment of the present invention, the composite layer 100 covers an entire surface of the semiconductor device 200. As such, a top-down view of the semiconductor device 200 with the composite layer 100 applied, the composite layer 100 completely covers the surface of the semiconductor device 200. And because the filler particles 104 are a homogenous distribution 102 of filler particles 104, the distribution is homogenous across the surface of the semiconductor device 200.

Figure 3:
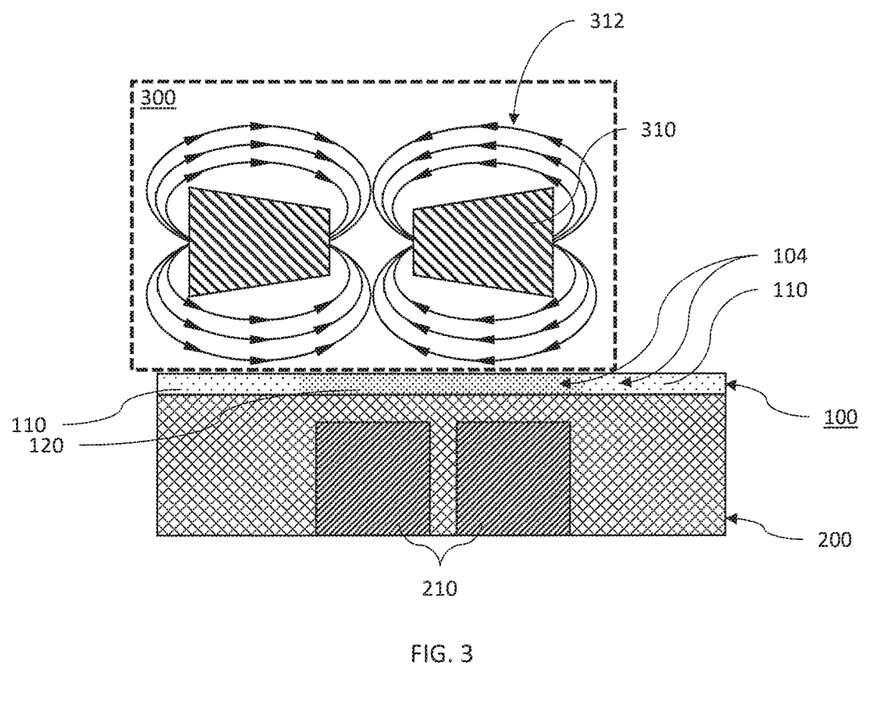
FIG. 3 is a cross-sectional showing a semiconductor device with a composite layer having particle position and density adjusted, in accordance with an embodiment of the present invention.

Referring now to FIG. 3, a cross-sectional showing a semiconductor device with a composite layer having particle position and density adjusted is depicted according to an embodiment of the present invention.

The composite layer 100 can be adjusted to adjust the distribution of the filler particles 104. The filler particles 104 in the composite layer 100 can increase the heat conductivity of the composite layer 100, but can also increase the mechanical strength, such as, e.g., Young's modulus, of the composite layer 100. Moreover, the filler particles 104 can increase Young's modulus of the composite layer 100 if the composite layer 100 is cured or annealed. Therefore, a higher concentration of filler particles 104 may be beneficial for thermal conductivity but detrimental for mechanical strength. Therefore, the composite layer 100 can be modified such that the filler particles 104 are in higher concentrations where heat is generated, and in lower concentrations where heat is not generated but mechanical strength is used for attaching other components via the composite layer 100.

A particle manipulator 300 can be used to manipulate the filler particles 104 of the composite layer 100 by emitting a wave or field to manipulate the filler particles 104 without direct contact. For example, the particle manipulator 300 can employ radiation via an emitter 310, such as, e.g., electric fields, magnetic fields, electro-magnetic radiation such as, e.g., light, acoustic radiation, or any other suitable field, wave or radiation for manipulating particles. Thus, the particle manipulator 300 can be any manipulation device having the emitter 310 that can bias the filler particles 104 of the composite layer to migrate towards or away from locations within the composite layer 100. According to aspects of the present invention, the particle manipulator 300 can, therefore, include a system or device for causing, e.g., ultra-sonic vibration, thermal convention, electro-static manipulation, magnetic manipulation, or any other manipulation technique.

According to one possible embodiment of the present invention, the particle manipulator 300 is an electro-magnetic manipulator with electro-magnetic heads 310. The electro-magnetic heads 310 each generates a magnetic field 312. The magnetic field 312 interacts with the filler particles 104 of the composite layer 100. Thus, a direction of orientation of the magnetic field 312 can be used to push filler particles 104 into a high concentration region 120 and away from a low concentration region 110. For example, the magnetic field 312 can be produced by each of two or more electro-magnetic heads 310. Each electro-magnetic head 310 can orient the magnetic field 312 in a direction towards an opposing electro-magnetic head 310. Thus, resulting magnetic field lines are oriented in a direction towards a middle region between the electro-magnetic heads 310. The filler particles 104 experience a force resulting from the respective magnetic fields 312 that pushes the filler particles 104 towards the middle region, causing a redistribution of filler particles 104 out of the low concentration region 110 into the high concentration region 120. The middle region and resulting high concentration region 120 can be an area over the semiconductor device 200 that has been selected, e.g., because the area generates heat. For example, the high concentration region 120 can be positioned over an area of the semiconductor device 200 including a processing core that stores or processes data through an electric signal, thereby producing heat. Accordingly, the low concentration regions 110 can be, e.g., positioned over areas of the semiconductor device 200 that is not electrically active and thus does not generate heat, or generates an amount of heat that does not affect the operation of other areas of the semiconductor device 200.

The particle manipulator 300 can be, e.g., a movable device such that the electro-magnetic heads 310 translate across the semiconductor device 200. Thus, the particle manipulator 300 can be used to redistribute filler particles 104 in the composite layer 100 while the particle manipulator 300 translates across a plane parallel to an interface between the composite layer 100 and the semiconductor device 200 to create complex patterns of concentration within the composite layer 100. For example, two electro-magnetic heads 310 can translate along a line across a width of the semiconductor device 200 while concurrently generating the magnetic fields 312. Thus, the electro-magnetic heads 310 impose a force on the filler particles 104 of the composite layer 100 while translating to push the filler particles 104 into the middle region along the line of translation to create the high concentration region 120 as a line across the width of the semiconductor device 200. However, other configurations are contemplated.

For example, more than two electro-magnetic heads 310 can be used to create a high concentration region 120 that is bounded on multiple sides to create a two-dimensionally bounded high concentration region 120. Or two electro-magnetic heads 310 can be used to pull filler particles 104 into the middle region from a first orientation, and then re-oriented at a perpendicular orientation to the original orientation and pull filler particles 104 into the middle region again. Thus, the filler particles 104 are pulled into high concentration region 120 such that the high concentration region 120 encompasses a hotspot produced by the semiconductor device 200. In one embodiment of the present invention, the high concentration region 120 has a uniform concentration of filler particles 104 in the area of the corresponding hotspot. Thus, filler particle concentration is constant through a thickness of the composite material 100 in the region of the hotspot. Additionally, the high concentration region 120 can be of any suitable shape in a cross-section parallel to an interface between the composite layer 100 and the semiconductor device 200 such that the hotspot is entirely encompassed. Thus, the high concentration region 120 can be, e.g., square, circular, elliptical, or any other axi-symmetric shape including n-sided polygons.

To facilitate heat conduction in the high concentration region 120, filler particle 104 concentration can have a suitable degree of concentration. For example, the high concentration region 120 can have a concentration in a range, e.g., of between about 80 percent and about 90 percent particle density by volume, or any other suitable concentration for optimizing heat conduction to mitigate hotspots. Additionally, the low concentration region 110, to facilitate mechanical strength, can have a concentration, e.g., below about 60 percent filler particle 104 density by volume, or any other suitable concentration for optimizing a strength of the low concentration region 110.

The electro-magnetic heads 310 can be controlled by, e.g., a computer or computer processor and a power supply, to vary in strength and direction according to a controllably applied voltage and current. Thus, the concentration of filler particles 104 can be tuned to have a highly controllable shape and concentration, including, e.g., a concentration gradient, across a horizontal plane through the composite layer 100 that is parallel to an interface between the composite layer 100 and the semiconductor device 200.

According to one embodiment, the hotspot can be created by an active component 210 such as, e.g., a processor core in the semiconductor device 200. The processor core can, e.g., have size of about 3.3 millimeters (mm) by about 5.04 mm, and thus an area of about 16.6 mm². The electro-magnetic heads 310 can pull filler particles 104 from a surrounding area within the composite layer 100 to form a high concentration region 120 directly over the active component 210. The filler particles 104 can be pulled from an area of about, e.g., nine times the area of the active component. In this embodiment, the filler particles 104 can, therefore, be pulled from an area within a radius of about 7 mm from a point directly above a center of the active component 210. However, other configurations are possible, with active components 210 having different shapes and sizes.

Filler particles 104 can be concentrated over each of the active components 210. Thus, the particle manipulator 300 can be moved from one active component 210 to another. In the event that the active components 210 are close together such that pulling filler particles 104 into a region over one active component 210 would pull the filler particles 104 from a region over an adjacent active 210, the area from which the filler particles 104 are pulled can be modified to be smaller or only from regions that are not over active components, such as, e.g., by selecting individual electro-magnetic heads 310 to use or by varying power to selected electro-magnetic heads 310 to prevent pulling the filler particles 104 from the adjacent high concentration region 120. Alternatively or in addition, if multiple active devices 210 are in such close proximity to each other that filler particles 104 would be pulled from areas over adjacent active components 210, the electro-magnetic heads 310 can be controlled to form a high concentration region 120 in an area that is over all of the active devices 210 that are in close proximity to each other.

While the particle manipulator 300 is described and depicted as redistributing the filler particles 104 of a composite layer 100 including a thermal interface material, other applications are also contemplated. For example, the particle manipulator 300 can be used to redistribute particles of any suspended particle system, including, e.g., phase change materials, doped fluids for electrical conduction pathways, or any other particle suspended in a material.

Figure 4:
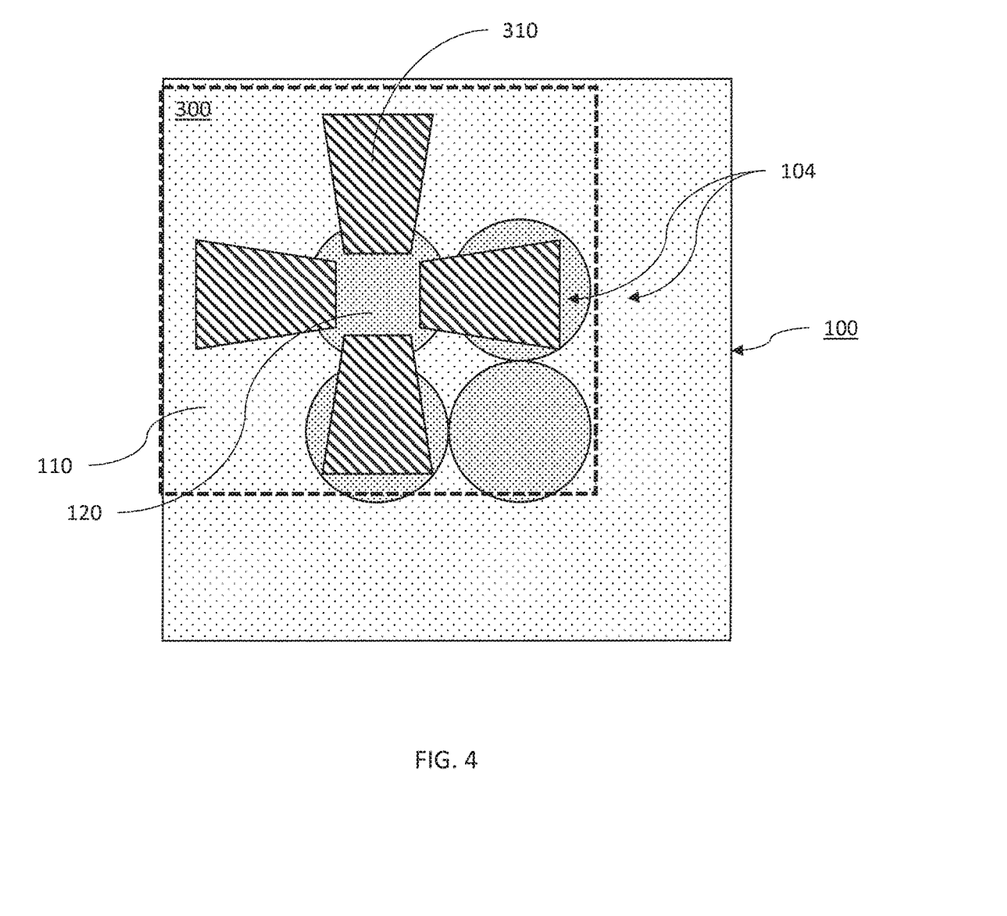
FIG. 4 is a top view showing the semiconductor device with the composite layer of FIG. 3 with particle position and density adjusted, in accordance with an embodiment of the present invention.

Referring not to FIG. 4, a top view showing the semiconductor device with the composite layer of FIG. 3 with particle position and density adjusted is depicted according to an embodiment of the present invention.

According to aspects of the present invention, four electro-magnetic heads 310 are employed in the particle manipulator 300. As described above, the high concentration region 120 is, therefore, bounded on a corresponding number of sides. Here, the number of sides is four, thus creating a substantially rectangular high concentration region 120. The shape of the high concentration region 120 can be adjusted by adjusting the distance between opposing electro-magnetic heads 310. Alternatively, the electro-magnetic heads 310 can be a single electro-magnetic head 310 that successively moves to four or more locations to move the filler particles 104 out of the low concentration region 110 of the composite layer 100 to the high concentration region 120. Any number of electro-magnetic heads 310 can be used to form high concentration regions 120 in any shape or configuration at any position within the composite layer 100. Thus, the high concentration region 120 can be positioned at a location and in a shape that corresponds with an active region of the semiconductor device 200 that generates heat, creating a hotspot according to a shape of the active region, such as, e.g., a processing core. As a result, the high concentration region 120 can more effectively conduct heat away from the hotspot due to the greater amount of heat conducting filler particles 104.

However, this greater amount of heat conducting filler particles 104 can have a detrimental effect on mechanical strength of the composite layer. But the low concentration regions 110 have fewer filler particles 104 due to the absence of hotspots in corresponding areas of the semiconductor device 200. Due to the relatively small amount of filler particles 104 in the low concentration region 110, the composite layer 100 has a high mechanical strength in the low concentration regions. Accordingly, the composite layer 100 is adjusted to have higher thermal conductive in areas where thermal conductivity is beneficial, while concurrently increasing mechanical strength in areas where thermal conductivity is less beneficial but mechanical strength is beneficial. Thus, the composite layer 100 is better formed for the semiconductor device 200 being used.

As described above, in the event that the active components 210 are close together such that pulling filler particles 104 into a region over one active component 210 would pull the filler particles 104 from a region over an adjacent active 210, the area from which the filler particles 104 are pulled can be modified to be smaller or only from regions that are not over active components, such as, e.g., by selecting individual electro-magnetic heads 310 to use or by varying power to selected electro-magnetic heads 310 to prevent pulling the filler particles 104 from the adjacent high concentration region 120. Alternatively or in addition, if multiple active devices 210 are in such close proximity to each other that filler particles 104 would be pulled from areas over adjacent active components 210, the electro-magnetic heads 310 can be controlled to form a high concentration region 120 in an area that is over all of the active devices 210 that are in close proximity to each other.

Figure 5:
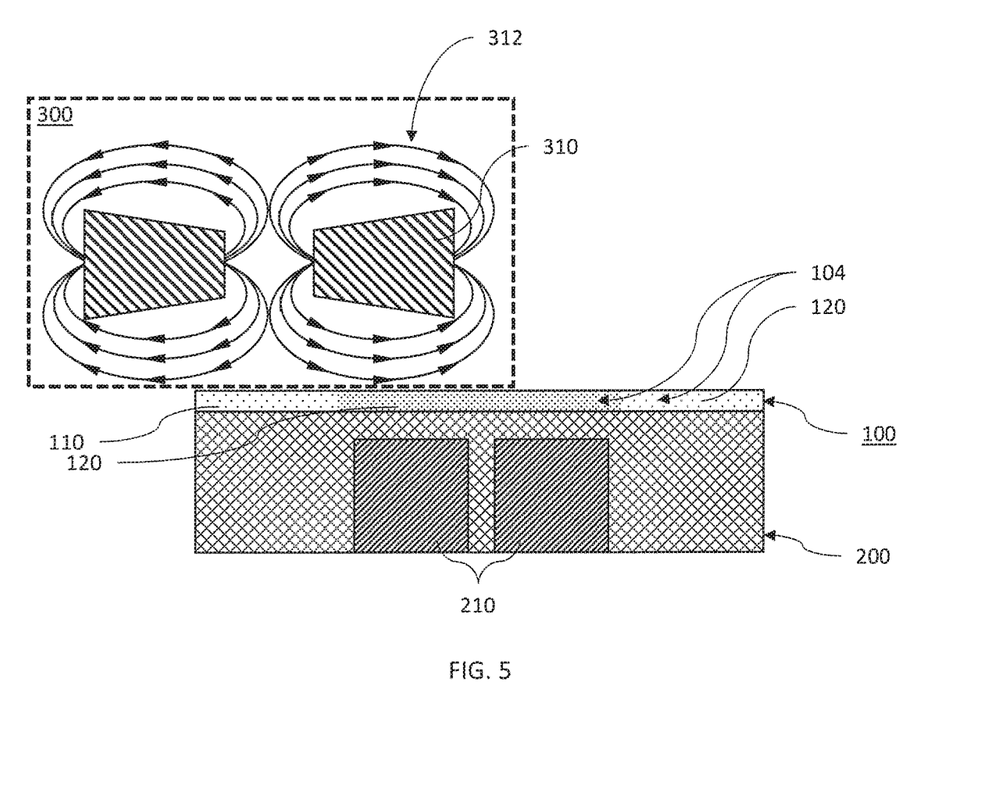
FIG. 5 is a cross-sectional showing a semiconductor device with a composite layer having particle position and density adjusted, in accordance with an embodiment of the present invention.

Referring now to FIG. 5, a cross-sectional showing a semiconductor device with a composite layer having particle position and density adjusted is depicted according to an embodiment of the present invention.

According to an aspect of the present invention, the particle manipulator 300 can be used to push filler particles 104 from an area. By reverse the magnetic field 312, the electro-magnetic heads 310 can push the filler particles 104 out of the middle region between the electro-magnetic heads 310, thus creating a low concentration region 110 in the middle region. Because the filler particles 104 are pushed from the low concentration region 110, the filler particles 104 then migrate into the high concentration region 120.

According to an embodiment of the present invention, the composite layer 100 is manipulated such that filler particles 104 are pushed out of an edge region of the semiconductor device 200 such that the filler particles 104 are pushed into a high concentration region 120 in a center of the semiconductor device 200. For example, the filler particles 104 can be pushed into the high concentration 120 progressively by translating the particle manipulator 300 across a width of the semiconductor device 200 while concurrently imposed the magnetic field 312 for a pass. Each pass of the particle manipulator 300 can be incrementally closer to the area over the active device 210 such that the particle manipulator 300 progressively pushes the filler particles 104 towards an area over the active device 210.

Alternatively, the particle manipulator 300 can remain stationary and impose the magnetic field 312 in a direction towards the area over the active devices 210 to form the high concentration region 120 without moving the particle manipulator 300. A row of electro-magnetic heads 310 can be used concurrently to achieve the high concentration region 120, or a single electro-magnetic head 310 can be used that repeats the pushing of the filler particles 104 in multiple locations over the semiconductor device 200.

As described above, according to one embodiment, the hotspot can be created by an active component 210 such as, e.g., a processor core in the semiconductor device 200. The processor core can, e.g., have size of about 3.3 millimeters (mm) by about 5.04 mm, and thus an area of about 16.6 mm². The electro-magnetic heads 310 can push filler particles 104 from a surrounding area within the composite layer 100 to form a high concentration region 120 directly over the active component 210. The filler particles 104 can be pushed from an area of about, e.g., nine times the area of the active component. In this embodiment, the filler particles 104 can, therefore, be pulled from an area within a radius of about 7 mm from a point directly above a center of the active component 210. However, other configurations are possible, with active components 210 having different shapes and sizes.

Figure 6:
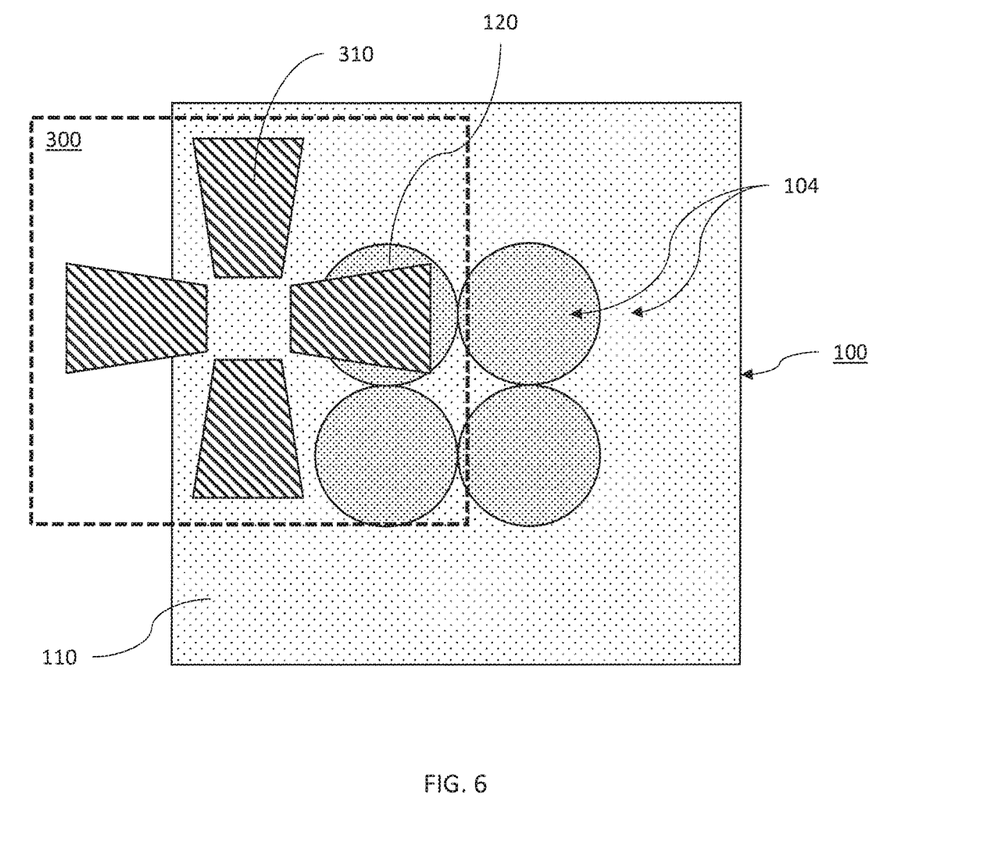
FIG. 6 is a top view showing the semiconductor device with the composite layer of FIG. 5 with particle position and density adjusted, in accordance with an embodiment of the present invention.

Referring not to FIG. 6, a top view showing the semiconductor device with the composite layer of FIG. 5 with particle position and density adjusted is depicted according to an embodiment of the present invention.

According to aspects of the present invention, four electro-magnetic heads 310 are illustratively employed in the particle manipulator 300 of one embodiment. As described above, the high concentration region 120 is, therefore, bounded on a corresponding number of sides. The shape of the high concentration region 120 can be adjusted by adjusting the positioning of each of electro-magnetic heads 310 such that the filler particles 104 are not pushed back into the low concentration region 110, such as, e.g., using a progressive pushing filler particles 104 with multiple incremental passes of the particle manipulator 300 across the semiconductor device 200. Any number of electro-magnetic heads 310 can be used to form high concentration regions 120 in any shape or configuration at any position within the composite layer 100. Thus, the high concentration region 120 can be positioned at a location and in a shape that corresponds with an active region of the semiconductor device 200 that generates heat, creating a hotspot according to a shape of the active component 210, such as, e.g., a processing core. As a result, the high concentration region 120 can more effectively conduct heat away from the hotspot due to the greater amount of heat conducting filler particles 104.

However, as described above, this greater amount of heat conducting filler particles 104 can have a detrimental effect on mechanical strength of the composite layer. But the low concentration regions 110 have fewer filler particles 104 due to the absence of hotspots in corresponding areas of the semiconductor device 200. Thus, by forming a high concentration region 120 over the active devices 210 and low concentration regions 110 elsewhere, the composite layer 100 is better formed for the semiconductor device 200 being used.

Figure 7:
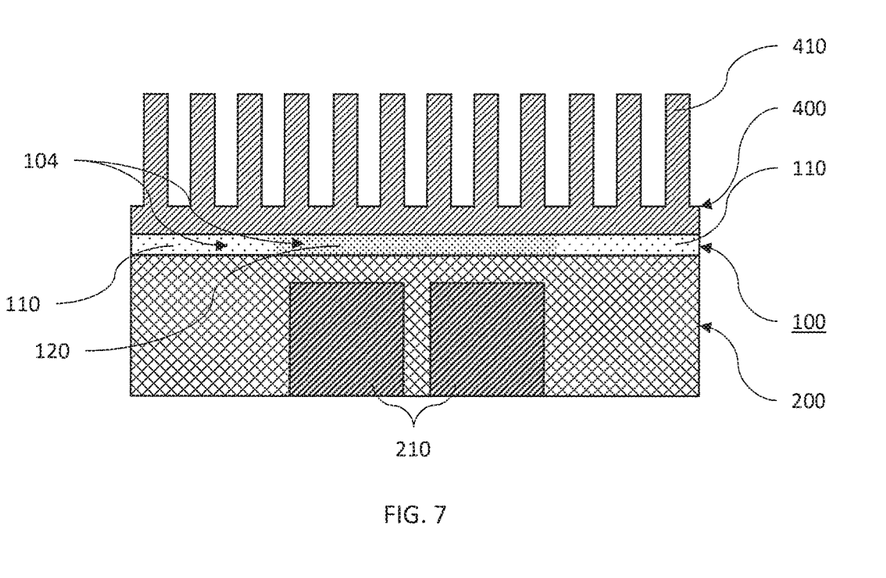
FIG. 7 is a cross-sectional view showing a semiconductor device having a composite layer with areas of high particle density and areas of low particle density as an interface with a heat sink, in accordance with an embodiment of the present invention.

Referring not to FIG. 7, a cross-sectional view showing a semiconductor device having a composite layer with areas of high particle density and areas of low particle density as an interface with a heat sink is depicted according to an embodiment of the present invention.

The composite layer 100 can be used as a thermal interface material between the semiconductor device 200 and a heat sink 400. To improve dissipation of heat from the semiconductor device 200 to the surrounding environment, the heat sink 400 can have multiple fins 410. The fins 410 can be attached to the heat sink 400 or the fins 410 can be integrally formed with the heat sink 400.

The composite layer 100 can be used to attached the heat sink 400 to the semiconductor device 200. Thus, the composite layer 100 can include, e.g., a glue or adhesive. Thus, the semiconductor device 200 can generate heat by the active components 210. The heat can therefore conduct through the composite layer 100 to the heat sink 400 and dissipate to the environment via the fins 410. However, to facilitate heat transfer from the semiconductor device 200 to the heat sink 400, the composite layer 100 can include the high concentration region 120 of filler particles 104 over the active components 210. Thus, a highly thermally conductive pathway through the composite layer 100 to the heat sink 400 is formed, improving the efficiency of heat transfer.

Moreover, because the high concentration region 120 is over the active components 210 and not over the edges of the semiconductor device 200, the composite layer 100 has greater strength in the low concentration regions 110 at the edges. Thus, the composite layer 100 is stronger in the low concentration regions 110, improving the attachment of the heat sink 400 to the semiconductor device 200.

The attachment of the heat sink 400 to the semiconductor device 200 can be improved by hardening the composite layer 100 by, e.g., curing or annealing. For example, according to one possible embodiment, the composite layer 100 is a curable or heat-curable resin or epoxy. While resin and epoxy have low thermal conductivity, the high concentration region 120 of filler particles 104 increases the thermal conductivity of the composite layer 100 in the area above the active components 410. However, the high concentration region 120 decreases mechanical strength and adhesion of the epoxy or resin. But the low concentration regions 110 have few filler particles 104. Thus, strength and adhesion in the low concentration regions 110 are high, particularly upon curing the epoxy or resin. Thus, the resin or epoxy can be cured by, e.g., applied heat such as, e.g., laser annealing, or electric heating, induction heating, a furnace among other heating methods. Alternatively, the epoxy or resin can be a two part polymer that cures chemically over time. Upon curing the composite layer 100, the heat sink 400 can be securely attached to the semiconductor device 200 without sacrificing thermal conductivity of the composite layer 100 in hotspots, such as areas over active components 210 such as, e.g., processing cores or memory cores.

Figure 8:
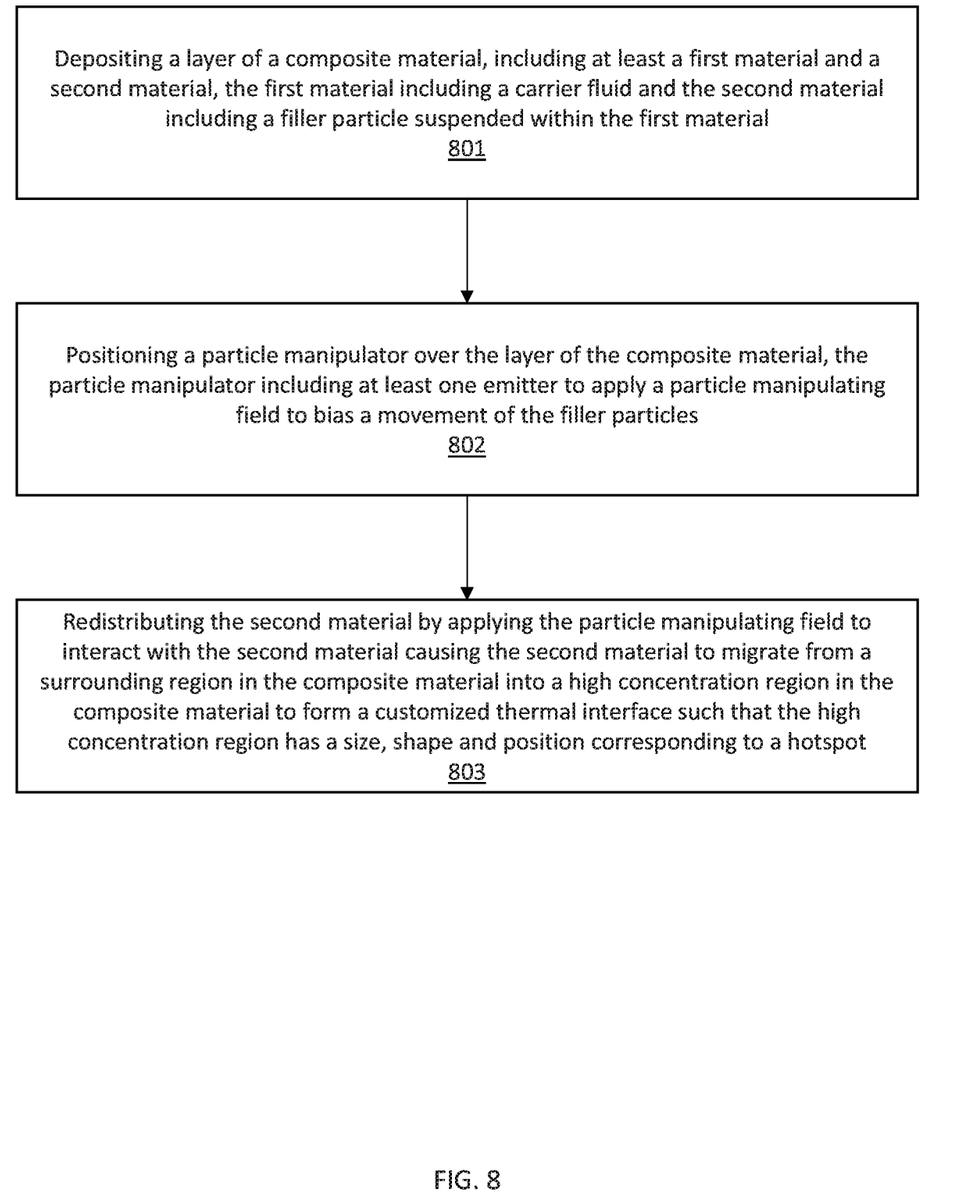
FIG. 8 is a block/flow diagram showing a system/method for forming a composite layer with areas of high particle density and areas of low particle density, in accordance with an embodiment of the present invention.

Referring not to FIG. 8, a block/flow diagram showing a system/method for forming a composite layer with areas of high particle density and areas of low particle density is depicted according to an embodiment of the present invention.

At block 801, depositing a layer of a composite material, including at least a first material and a second material, the first material including a carrier fluid and the second material including a filler particle suspended within the first material.

At block 802, positioning a particle manipulator over the layer of the composite material, the particle manipulator including at least one emitter to apply a particle manipulating field to bias a movement of the filler particles.

At block 803, redistributing the second material by applying the particle manipulating field to interact with the second material causing the second material to migrate from a surrounding region in the composite material into a high concentration region in the composite material to form a customized thermal interface such that the high concentration region has a size, shape and position corresponding to a hotspot.

Having described preferred embodiments of a system and method for filler particle position and density manipulation with applications in thermal interface materials (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a thermal interface material, the method comprising: depositing a layer of a composite material, including at least a first material and a second material, the first material including a carrier fluid and the second material including a filler particle suspended within the first material; positioning a particle manipulator directly over only one side of the layer of the composite material, the particle manipulator including two electro-magnetic heads each having a trapezoidal shape with a shorter side facing a shorter side of the other in a cross-sectional view and each generating a magnetic field, the magnetic fields oriented in a direction opposite to each other and between the magnetic heads, to apply a particle manipulating field to bias a movement of the filler particle, the particle manipulator being a movable device translating across a plane parallel to the composite material; and redistributing the second material by applying the particle manipulating field to interact with the second material causing the second material to migrate from a surrounding region in the composite material into a high concentration region in the composite material to form a customized thermal interface such that the high concentration region is configured and positioned corresponding to a hotspot of a semiconductor device.

2. The method as recited in claim 1, wherein the two electro-magnetic heads are controlled by a processor and a power supply to vary in strength and direction according to a controllably applied voltage and current.

3. The method as recited in claim 1, further including annealing the first material to harden the first material.

4. The method as recited in claim 3, wherein annealing the first material includes heating the first material with a heating device selected from the group consisting of a laser, a furnace and an induction heater.

5. The method as recited in claim 1, wherein repositioning the second material includes forming the high concentration region with a concentration gradient that decreases towards the surrounding region.

6. The method as recited in claim 1, wherein the particle manipulator includes particle manipulation selected from the group consisting of ultra-sonic vibration, electro-static manipulation and thermal convention.

7. The method as recited in claim 1, wherein the magnetic field pulls the second material through the first material into a middle region between the two electro-magnetic heads of the particle manipulator.

8. The method as recited in claim 1, wherein the layer of composite material is deposited on a semiconductor device.

9. The method as recited in claim 8, wherein the high concentration region is positioned within the composite material over a hotspot formed by an active component of the semiconductor device.

10. The method as recited in claim 1, further including attaching a heat sink to a semiconductor device via the layer of composite material by hardening the layer of composite material such that the surrounding region mechanically attaches the heat sink to the semiconductor device.

11. A method for forming a thermal interface material, the method comprising: depositing a layer of a composite material on a semiconductor device including an active component, the composite material including at least a first material and a second material, the first material including a carrier fluid and the second material including a filler particle suspended within the first material; positioning a particle manipulator directly over only one side of the layer of the composite material, the particle manipulator including two electro-magnetic heads each having a trapezoidal shape with a shorter side facing a shorter side of the other in a cross-sectional view and each generating a magnetic field, the magnetic fields oriented in a direction opposite to each other and between the magnetic heads, to apply a particle manipulating field to bias a movement of the filler particle, the particle manipulator being a movable device translating across a plane parallel to the composite material; redistributing the second material by applying the particle manipulating field to interact with the second material causing the second material to migrate from a surrounding region in the composite material into a high concentration region in the composite material to form a customized thermal interface such that the high concentration region is configured and positioned corresponding to a hotspot of the semiconductor device; and attaching a heat sink to the semiconductor device via the layer of the composite material.

12. The method as recited in claim 11, wherein the two electro-magnetic heads are controlled by a processor and a power supply to vary in strength and direction according to a controllably applied voltage and current.

13. The method as recited in claim 11, further including annealing the first material to harden the first material.

14. The method as recited in claim 13, wherein annealing the first material includes heating the first material with a heating device selected from the group consisting of a laser, a furnace and an induction heater.

15. The method as recited in claim 11, wherein repositioning the second material includes forming the high concentration region with a concentration gradient that decreases towards the surrounding region.

16. The method as recited in claim 11, wherein the particle manipulator includes particle manipulation selected from the group consisting of ultra-sonic vibration, electro-static manipulation and thermal convention.

17. The method as recited in claim 11, wherein the magnetic field pulls the second material through the first material into a middle region between two the electro-magnetic heads of the particle manipulator.

18. A thermal interface material comprising: a layer of a first material including a cured carrier fluid; a second material embedded within the first material such that the second material is concentrated in a high concentration region of the first material, via a particle manipulator positioned directly over only one side of the layer of the first material, the particle manipulator including two electro-magnetic heads each having a trapezoidal shape with a shorter side facing a shorter side of the other in a cross-sectional view and each generating a magnetic field, the magnetic fields oriented in a direction opposite to each other and between the magnetic heads, to form a customized thermal interface such that the high concentration region is configured and positioned corresponding to a hotspot of a semiconductor device, the high concentration region being surrounded by a low concentration region having a lower density of the second material than the high concentration region, wherein the particle manipulator is a movable device translating across a plane parallel to the first material.

19. The thermal interface material as recited in claim 18, wherein the two electro-magnetic heads are controlled by a processor and a power supply to vary in strength and direction according to a controllably applied voltage and current.

20. The thermal interface material as recited in claim 18, wherein the high concentration region is positioned within the composite material over a hotspot formed by an active component of a semiconductor device.

* * * * *